(12) United States Patent
Yamaura et al.

(10) Patent No.: US 6,468,584 B1
(45) Date of Patent: Oct. 22, 2002

(54) METHOD FOR MANUFACTURING CONDUCTIVE THIN FILM PATTERNED SUBSTRATE

(75) Inventors: Tatsuo Yamaura, Mobara (JP); Shigeo Itoh, Mobara (JP)

(73) Assignee: Futaba Corporation, Mobara (JP)

( * ) Notice: Subject to any disclaimer, the term of this patent is extended or adjusted under 35 U.S.C. 154(b) by 139 days.

(21) Appl. No.: 09/688,356

(22) Filed: Oct. 16, 2000

(30) Foreign Application Priority Data

Oct. 15, 1999 (JP) .......................................... 11-294124
Oct. 5, 2000 (JP) ...................................... 2000-306035

(51) Int. Cl.⁷ ................................................ B05D 5/12
(52) U.S. Cl. .................... 427/120; 427/375; 427/376.2; 427/261; 427/279; 427/64
(58) Field of Search ............................... 427/64, 66, 68, 427/120, 197, 226, 375, 376.2, 258, 261, 279, 287

(56) References Cited

U.S. PATENT DOCUMENTS

| 5,543,685 A | * | 8/1996 | Okamoto et al. | ............ 313/496 |
| 5,643,685 A | * | 7/1997 | Torikoshi | ..................... 428/690 |
| 5,994,008 A | * | 11/1999 | Ogawa et al. | ................. 430/28 |

* cited by examiner

*Primary Examiner*—Brian K. Talbot
(74) *Attorney, Agent, or Firm*—Oblon, Spivak, McClelland, Maier & Neustadt, P.C.

(57) ABSTRACT

A method for manufacturing a conductive thin film patterned substrate which is capable of being practiced at a reduced cost without causing environmental pollution while eliminating any troublesome after-treatment. An insulating substrate made of glass or the like is formed thereon with an InSnO, SnSbO, ZnAlO or Al thin film. Then, a phosphate low-softening glass paste layer is formed on the thin film. A portion of the thin film contiguous to an insulating layer made of the low-softening glass paste melts into a glass region to form an insulating layer region, so that a conductive thin film region may be patterned as electrodes.

8 Claims, 3 Drawing Sheets

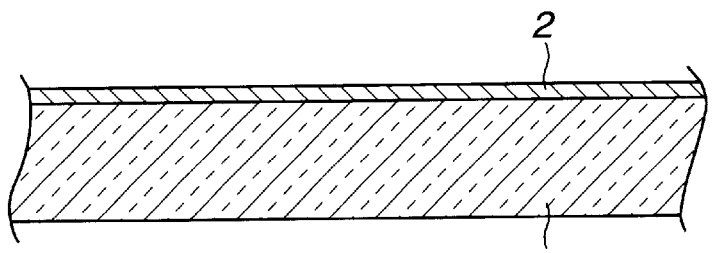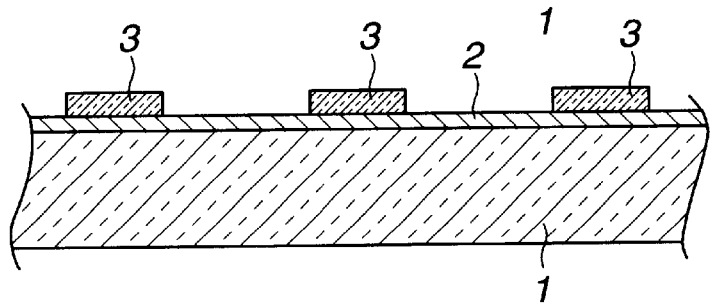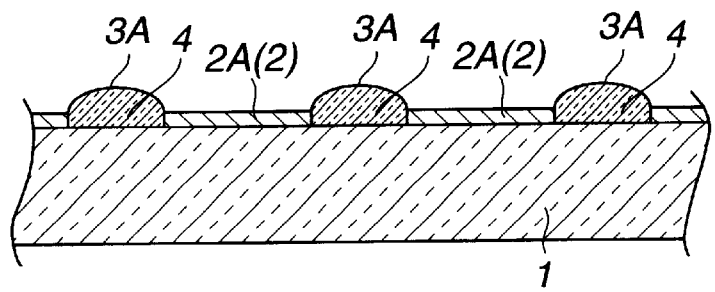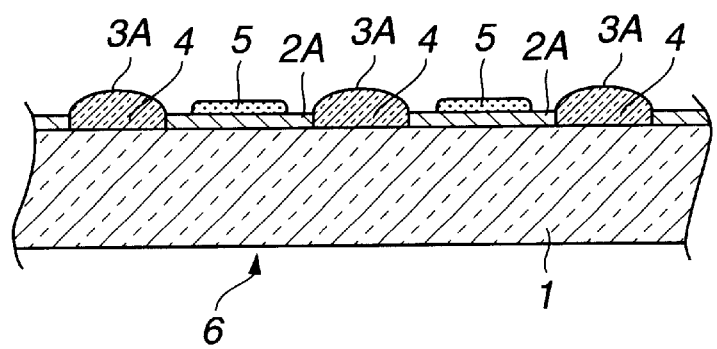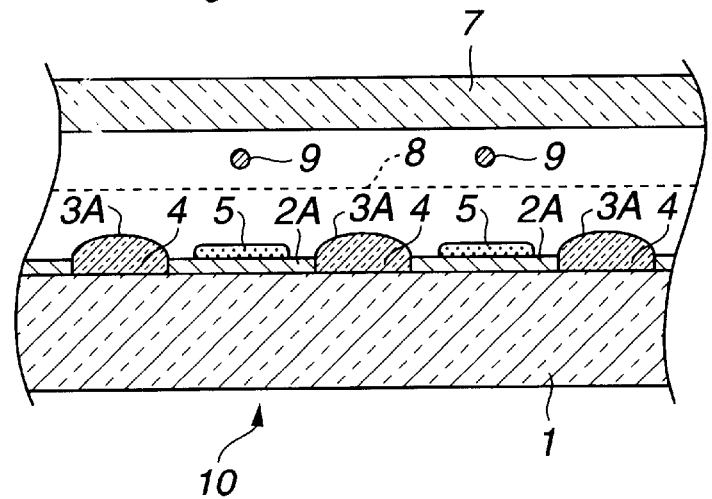
FIG.1(a)
FIG.1(b)
FIG.1(c)
FIG.1(d)
FIG.1(e)

METHOD FOR MANUFACTURING CONDUCTIVE THIN FILM PATTERNED SUBSTRATE

BACKGROUND OF THE INVENTION

This invention relates to a method for manufacturing a conductive thin film patterned substrate or a substrate having a conductive thin film patterned thereon, and more particularly to a method for a patterning a conductive thin film such as a transparent conductive thin film of ITO, SnSbO, ZnAlO or the like or a metal thin film of Al or the like by thick film printing.

Conventionally, in manufacturing of, for example, a fluorescent display device for graphic display, a transparent conductive film of indium tin oxide (ITO) or the like or a metal film of Al or the like is formed on a surface of a glass substrate and then a photoresist is coated on the conductive thin film laminatedly or by lamination. Then, the thus-coated photoresist is subject to photolithography wherein exposure, development and etching are carried out with respect to the photoresist, so that conductive thin film patterns may be provided on the substrate.

Then, an insulating layer is formed in each of gaps between the thus-formed conductive thin film patterns by thick film printing or the like. Subsequently, a phosphor layer is formed on each of display regions of the conductive thin film by electro-deposition, thick film printing or the like, to thereby provide anode electrodes.

Unfortunately, the conventional techniques described above cause the number of steps carried out for patterning of the conductive thin film made of ITO, SnSbO, ZnAlO or Al in photolithography to be increased. In addition, the conventional techniques require a troublesome after-treatment such as a treatment of waste liquid produced in washing and etching steps.

There has been also known in the art a powdery etching material which can be printed on a surface of a glass substrate and then subject to calcination and washing with water for removal from the glass substrate. In addition, there has been developed a paste material which can be used for screen printing and decomposed by calcination to provide an ITO film. However, such materials each fail to exhibit conductivity equal to that of a film formed by sputtering.

Furthermore, there has been provided a thin film in the prior art which is made of SnSbO and known as a nesa film in the art. The thin film is increased in chemical strength, resulting in being promising as a transparent conductive film such as that for a display device. However, it has a problem of rendering formation of patterns difficult.

SUMMARY OF THE INVENTION

The present invention has been made in view of the foregoing disadvantage of the prior art.

Research and development by the inventors on a fluorescent display device revealed that when a paste of phosphate fritted glass which is used as a sealing agent during formation of an envelope for a fluorescent display device is deposited in the form of a film on an ITO conductive thin film and then subject to calcination, the ITO film arranged under the phosphate glass loses conductivity.

As a result of our careful study of the above-described phenomenon, it was found that the $SnO$—$P_2O_5$—$ZnO$ glass or phosphate low-melting glass which is deposited laminatedly or by lamination on a surface of the ITO conductive thin film formed on a surface of an insulating substrate has a softening point of 425° C., therefore, calcination of the glass at 500° C. in an air atmosphere leads to a reduction in viscosity of the glass, resulting in $InO_2$ and $SnO_2$ which permit the ITO film to exhibit conductivity melting into the glass at an interface between the ITO film and the glass, to thereby cause vanishment of the ITO and therefore vanishment of $InO_2$ and $SnO_2$. This would be the reason why the conductivity is lost.

This was proved by the fact that microscopic observation which was made on a region or portion of the ITO positioned below the phosphate glass which lost conductivity clearly revealed melting of the ITO film into the glass softened, as described hereinafter with reference to FIGS. 1 to 3.

Further, a fluorescent display device was manufactured by laminatedly depositing an insulating paste mainly consisting of the above-described $SnO$—$P_2O_5$—$ZnO$ glass which is phosphate glass on an ITO film formed on a glass substrate and then subjecting the glass substrate to calcination at 500° C. in an air atmosphere to form an insulating layer, followed by lamination of a phosphor layer on each of conductive regions or portions of the ITO film. As a result, it was found that arrangement of the insulating layer permits a resistance of electrodes adjacent thereto to be increased to a level as high as 2 to 5MΩ or more. This indicates that the fluorescent display device exhibits satisfactory insulating properties.

Accordingly, it is an object of the present invention to provide a method for manufacturing a conductive thin film patterned substrate which is capable of being practiced at a reduced cost without substantially causing any environmental pollution.

It is another object of the present invention to provide a method for manufacturing a conductive thin film patterned substrate which is capable of eliminating any troublesome after-treatment as required in the prior art.

In accordance with the present invention, a method for manufacturing a conductive thin film patterned substrate is provided. The method includes the steps of forming a conductive thin film on an insulating substrate and carrying out pattern formation of an insulating thick film layer consisting of low-softening glass having a chemical composition which leads to vitrification of the conductive thin film formed on the insulating substrate. The insulating thick film layer is formed on the conductive thin film. The method also includes the step of carrying out calcination which permits a portion of the conductive thin film positioned under the insulating thick film layer to be vitrified integrally with the insulating thick film layer.

Also, in accordance with the present invention, a method for manufacturing a conductive thin film patterned substrate is provided. The method includes the steps of forming a conductive thin film on an insulating substrate and printing a paste consisting of a low-softening glass powder having a chemical composition which leads to vitrification of the conductive thin film on portions of the conductive thin film which are desired to be changed so as to exhibit insulating properties, to thereby carry out pattern formation of an insulating thick film layer. The insulating thick film layer is formed on the conductive thin film. The method also includes the step of carrying out calcination which permits a portion of the conductive thin film layer positioned under the insulating thick film layer to be vitrified integrally with the insulating thick film layer, whereby patterning of an insulating thin film region and a conductive thin film region is carried out.

In a preferred embodiment of the present invention, the conductive thin film has a thickness of 300 nm or less.

In a preferred embodiment of the present invention, the conductive thin film is made of a material selected from the group consisting of materials represented by general formulas InSnO, SnSbO and ZnAlO, and Al.

In a preferred embodiment of the present invention, the low-softening glass is phosphate glass.

In a preferred embodiment of the present invention, the low-softening glass is SnO—$P_2O_5$—ZnO glass.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein:

FIGS. 1(a) to 1(e) each are a fragmentary sectional view showing each of steps in manufacturing of a fluorescent display device which is an embodiment of a method according to the present invention;

DETAILED DESCRIPTION OF THE PREFERRED EMBODIMENTS

Now, the present invention will be described hereinafter with reference to the accompanying drawings.

Figure 3:
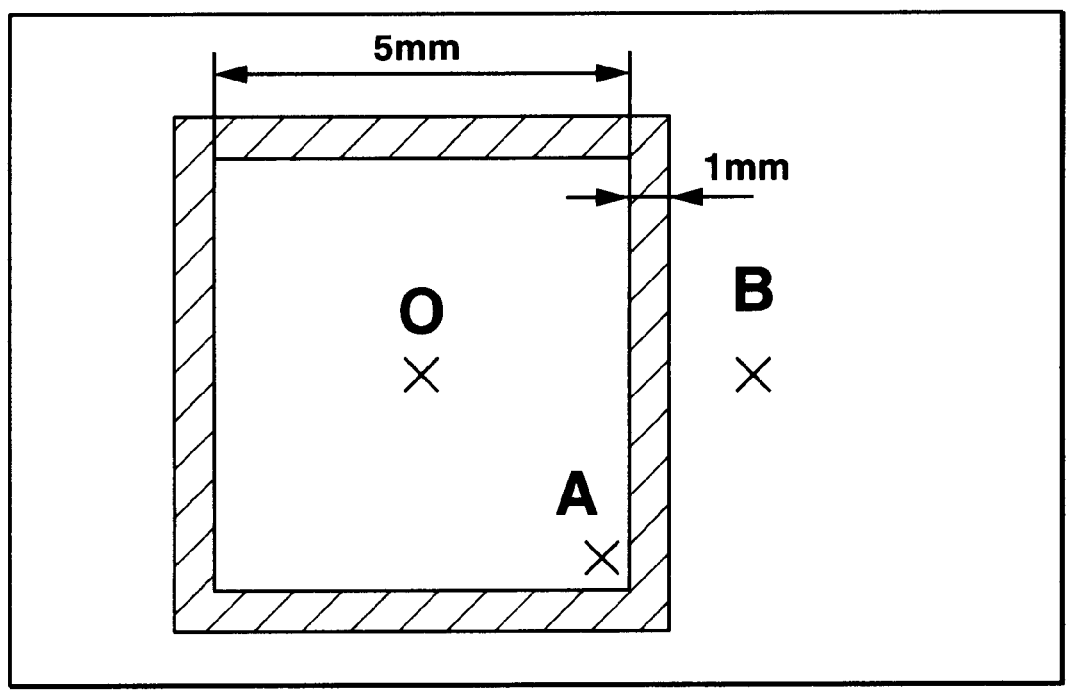
FIG. 3 is a schematic view showing a test pattern used for measuring a resistance of a conductive thin film shielded by an insulating region in the present invention.

The inventors evaluated characteristics of a conductive thin film pattern of the present invention by means of a test pattern as shown in FIG. 3. The evaluation was made according to the following procedure:

(1) ITO is deposited in the form of a film of about 300 nm in thickness on a surface of a glass substrate by sputtering.

(2) An insulating paste mainly consisting of SnO—$P_2O_5$—ZnO glass which is phosphate glass is deposited in the form of a frame of 1 mm in width positioned outside a square having each side of 5 mm on the ITO thin film by thick film printing.

(3) The glass substrate having the insulating paste thus formed by lamination or laminatedly is subject to calcination at a temperature of 450 to 500° C. in an air atmosphere, to thereby form the ITO into an insulating film.

(4) A resistance between a center O of the test pattern and a point A positioned within the frame-like insulating pattern or between two points on the ITO thin film and that between the center O of the test pattern and a point B positioned outside the insulating pattern and in proximity to the pattern or between two points on the ITO thin film formed into the insulating film are measured by means of an insulation tester.

(5) Then, the glass substrate and a section of an interface between the ITO thin film and the insulating layer are subject to microscopic observation by means of a microscope of 30000 magnifications.

More particularly, the evaluation was carried out as follows:

As shown in FIG. 1(a), an ITO thin film 2 was formed on a whole front surface of an insulating substrate or glass substrate 1 by sputtering. Then, as shown in FIG. 1(b), an insulating paste 3 mainly consisting of SnO—$P_2O_5$—ZnO glass which is phosphate low-melting glass was laminatedly formed on each of predetermined portions or regions of the ITO thin film by screen printing. Thereafter, the glass substrate 1 which has the ITO thin film thus formed thereon with the insulating paste 3 was subject to calcination at 430 to 500° C. in an oven at an air atmosphere. This resulted in an insulating layer 3A wherein the ITO film underlying the insulating paste 3 melts into the insulating paste being formed, as shown in FIG. 1(c).

A section of each of an interface 4 between the ITO thin film 2 and the insulating layer 3A and a region of the ITO film on which the insulating layer is not formed was observed by means of a microscope of 30000 magnifications.

The observation by the microscope revealed that the ITO thin film 2 is substantially lost from the region of the glass substrate on which the insulating layer 3 is formed, whereas it remains on the region of the glass substrate on which the insulating layer 3 is not formed.

Thus, the above-described losing of the ITO thin film from the region of the glass substrate on which the insulating layer 3 is formed leads to formation of non-conductive regions 4 and the ITO thin film on the glass substrate on which the insulating layer 3 is not formed forms conductive regions 2A, so that a conductive thin film patterned substrate or a substrate having a conductive thin film patterned thereon may be formed.

Also, the glass substrate on which the ITO thin film having the insulating paste mainly consisting of phosphate low-melting glass or SnO—$P_2O_5$—ZnO glass deposited thereon by lamination or laminatedly is formed was subject to calcination for 10 to 30 minutes at a temperature of 400° C. lower than 425 ° C. which is a melting point of the glass in an oven at an air atmosphere, resulting in an insulating layer being formed. The calcination failed to permit the ITO thin film to be changed into glass, resulting in the ITO thin film failing to diffuse into the insulating layer.

Further, in connection with each of conductive thin films respectively made of materials represented by general formulas SnSbO and ZnAlO and a conductive thin film made of Al, the inventors measured a resistance of the conductive thin film depending on a calcination temperature and calcination time, a resistance thereof after the calcination, a resistance between the center O of the test pattern and the point A positioned in the insulating pattern, and a resistance between the center O of the test pattern and the point B positioned outside the insulating pattern and in proximity thereto by means of the insulation tester.

Moreover, the glass substrate and a section of an interface between the ITO thin film and the insulating layer were subject to microscopic observation by means of a microscope of 30000 magnifications.

Results of the evaluation were as follows:

A resistance between the center O of the frame-like insulating test pattern provided on the ITO thin film formed into a thickness of 300 nm and the point B positioned outside the insulating test pattern was measured to be 20MΩ or more, whereas a resistance between the center O and the point A on the ITO thin film was measured to be 100Ω.

A resistance between the center O of the insulating pattern formed on the SnSbO thin film formed into a thickness of 200 nm and the point B positioned outside the insulating test pattern was measured to be 20Ω or more, whereas a resistance between the center O of the insulating pattern and the point A on the ITO thin film was 100Ω.

The glass substrate on which the insulating paste mainly consisting of the phosphate low-melting glass or SnO—

$P_2O_5$—ZnO glass is formed by lamination or laminatedly was subject to calcination at 500° C. for 10 minutes.

A resistance between the center O of the insulating pattern formed on the ZnAlO thin film formed into a thickness of 250 nm and the point B positioned outside the insulating test pattern and in proximity thereto was measured to be 20MΩ or more, whereas a resistance between the center O of the insulating pattern and the point A on the ITO thin film was 300Ω.

The glass substrate on which the insulating paste mainly consisting of the phosphate low-melting glass or SnO—$P_2O_5$—ZnO glass is formed laminatedly was subject to calcination at 450° C. for 30 minutes.

A resistance between the center O of the insulating pattern formed on the Al thin film formed into a thickness of 100 nm and the point B positioned outside the insulating test pattern and in proximity thereto was measured to be 20MΩ or more, whereas a resistance between the center O of the insulating pattern and the point A on the ITO thin film was 100Ω.

The glass substrate on which the insulating paste mainly consisting of the phosphate low-melting glass or SnO—$P_2O_5$—ZnO glass is formed by lamination was subject to calcination at 500° C. for 10 minutes.

Thus, as described above, Al, an oxide of In, that of Sn or that of Sb which gives conductivity to the region interposed between the insulating paste layer mainly consisting of the phosphor low-melting glass or SnO—$P_2O_5$—ZnO glass and laminated on the ITO, SnSbO, ZnAlO or Al thin film and the insulating substrate is continuously divided into the insulating region wherein the thin film melts into the phosphate low-melting glass or SnO—$P_2O_5$—ZnO glass and the conductive region constituted of the ITO, SnSbO, ZnAlO or Al thin film through calcination at 450° C. for 30 to 50 minutes in an air atmosphere.

Now, the method of the present invention will be further described with reference to FIGS. 1(a) to 2(e), wherein FIGS. 1(a) to 1(e) show steps in manufacturing of a fluorescent display device which is a first embodiment of the method of the present invention and FIGS. 2(a) to 2(e) show steps in manufacturing of a field emission type display device which is a second embodiment of the method of the present invention.

In the first embodiment of the present invention, first of all, a transparent conductive film 2 made of a material mainly consisting of indium oxide such as, for example, ITO or the like is formed into a predetermined thickness of, for example, about 300 nm on a heat-resistant and insulating substrate 1 made of glass or the like by suitable techniques such as sputtering or the like, as shown in FIG. 1(a).

Then, 80 parts of a powder of 5 μm in average diameter obtained by grinding SnO—$P_2O_5$—ZnO low-melting glass ($SnO_2$: 62 wt %, $P_2O_5$: 35 wt %, ZnO: 3 wt %) and 20 parts of an ethyl cellulose solution in butyl carbitol acetate are kneaded to prepare a low-softening glass paste or insulating paste.

Any oxide acting as a fluid filler may be added to the paste. The oxides include, for example, $Al_2O_3$, $TiO_2$ and the like.

Thereafter, as shown in FIG. 1(b), layers 3 of the thus-prepared low-softening glass paste are pattern-printed on portions of the transparent conductive film 2 which are not required to exhibit conductivity or portions thereof except luminous regions of a display pattern and wirings by screen printing using a 200-mesh screen made of stainless steel. In the illustrated embodiment, the low-softening glass paste layers 3 each may be formed into a thickness of 20 to 25 μm by printing based on, for example, 100 to 300 nm which is a thickness of a transparent electrode acting as a ground. Then, calcination is carried out at 500° C. for 10 minutes in an air atmosphere. This permits each of portions of the transparent conductive film 2 positioned below insulating layers 3A of the low-softening glass to be integrated with the low-softening glass to form an insulating layer 4 lacking conductivity. Then, the substrate 1 is formed thereon with anode electrodes 2A including wirings and made of the transparent conductive film 2, resulting in luminous regions of the display pattern being formed.

In the illustrated embodiment, the $P_2O_5$ fritted glass mainly consists of SnO—$P_2O_5$—ZnO glass. Alternatively, it may mainly consists of SnO—$P_2O_5$ glass or ZnO—$P_2O_5$ glass.

Subsequently, as shown in FIG. 1(d), the anode electrodes 2A each are formed on a portion thereof constituting the display pattern with a phosphor layer 5 by screen printing of a phosphor paste such as, for example, ZnO:Zn or the like thereon. Then, the substrate 1 is formed on an outer periphery thereof with a sealing glass material by printing and then calcination is carried out at 500° C. for 10 minutes, resulting in an anode substrate 6 being completed.

Then, a casing constituted by a transparent insulating front cover and side plates (not shown), grids or control electrodes 8, and filamentary cathode electrodes 9 are positioned with respect to the thus-completed anode substrate 6. Then, the anode substrate 6 and envelope are sealed at an outer periphery thereof to each other, to thereby form an envelope. Thereafter, the envelope is evacuated at a high vacuum, to thereby provide a fluorescent display device 10, as shown in FIG. 1(e).

Now, the second embodiment of the present invention will be described with reference to FIGS. 2(a) to 2(e).

Figure 2A:
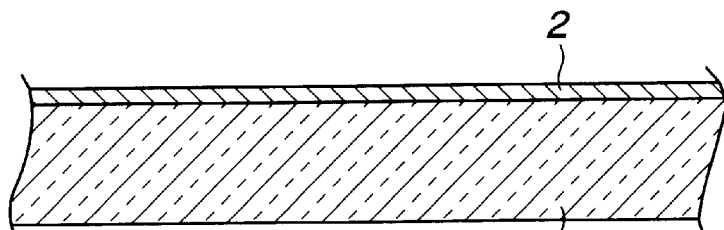
FIGS. 2(a) to 2(e) each are a fragmentary sectional view showing each of steps in manufacturing of a field emission type display device which is another embodiment of a method according to the present invention.
Figure 2B:
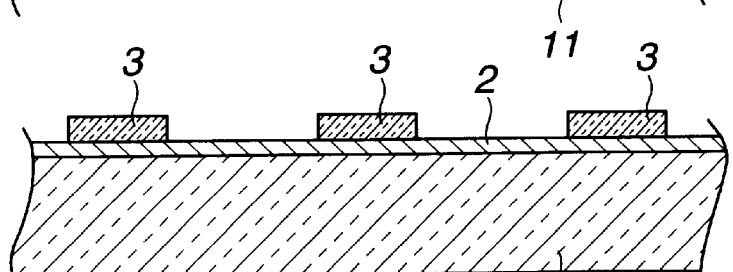

First, as shown in FIG. 2(a), a transparent conductive film 2 made of a material such as, for example, ITO or the like mainly consisting of indium oxide is coated all over a heat-resistant insulating substrate 11 by deposition, chemical vapor deposition (CVD), printing or the like. Then, as shown in FIG. 2(b), the transparent conductive film 2 is formed thereon with low-softening glass paste layers 3 of a predetermined thickness in a stripe-like manner so as to be spaced from each other at predetermined intervals.

Figure 2C:
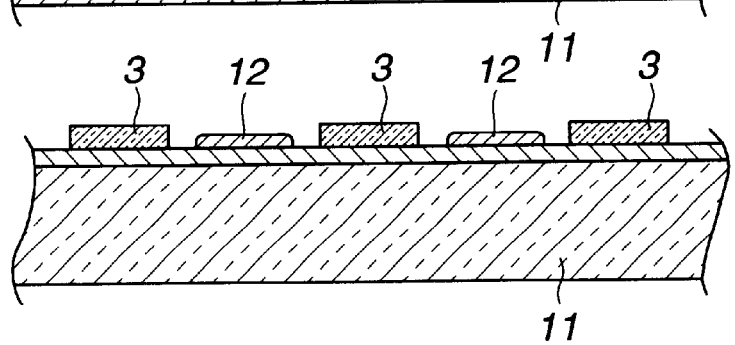

Then, as shown in FIG. 2(c), an emitter layer 12 is formed on the transparent conductive film 2 so as to be positioned between each adjacent two of the low-softening glass paste layers 3. The emitter layers 3 each may be made of a material mainly consisting of a powder such as, for example, carbon nanotubes, graphite, diamond-like carbon (DLC), a diamond powder, nitride or the like.

After formation of the emitter layers 12 described above, the substrate 11 is subject to calcination at 500° C. for 10 minutes in an air atmosphere. The calcination temperature and time described above are merely illustrative. They may be varied depending on a composition of the low-softening glass paste layer 3 used, as in the first embodiment described above. They may be limited to any specific values so long as they ensures pattern formation at a predetermined configuration without causing flowing of the low-softening glass paste layers 3 due to softening thereof.

Figure 2D:
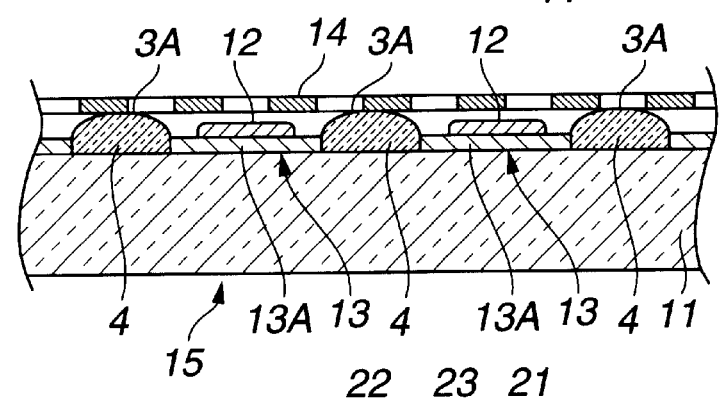

The calcination, as shown in FIG. 2(d), permits each of portions of the transparent conductive film 2 positioned under insulating layers 3A made of the low-softening glass cured by the calcination to form each of insulating films 4 lacking or free of conductivity. This results in cathode stripe lines 13 which are kept insulated from each other by the insulating films 4 being provided.

Subsequently, the insulating layers 3A made of the cured low-softening glass are formed thereon with gate electrodes or lead-out electrodes 14 in a stripe-like manner so as to form a matrix by cooperation with the cathode stripe lines 13. The gate electrodes 14 each may be made of a metal material such as, for example, Al, Ag, Nb or the like and formed into a mesh-like thin film and function to permit electrons emitted from each of the emitter layers 12 to travel through mesh-like openings of the gate electrodes 14. This provides a field-emission cathode substrate 15 completed.

Figure 2E:
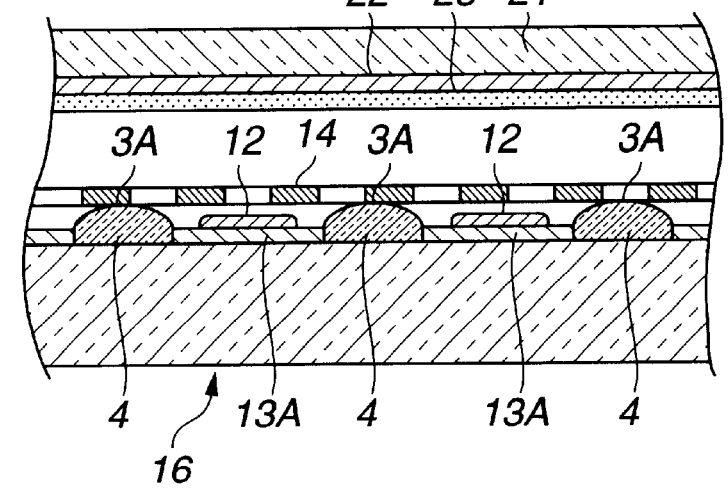

Thereafter, an anode substrate 21 manufactured separately from the cathode substrate 15 is sealedly joined at an outer periphery thereof to the cathode substrate 15 by means of a sealing glass material, to thereby provide an envelope. Then, the envelope is subject to evacuation, resulting in a high vacuum atmosphere being obtained in the envelope, leading to completion of a field emission type display device 16 as shown in FIG. 2(e).

Alternatively, the above-described anode substrate 21 may include, for example, an anode electrode 22 made of a transparent conductive film of ITO or the like and formed all over the substrate 21 and a phosphor layer 23 deposited all over the anode electrode 22 and constructed so as to exhibit a predetermined luminous color due to impingement of electrons emitted from the emitter layers 12 arranged on the cathode substrate 15 thereon.

In the field emission display device 16 thus formed, a scan signal is subsequently fed to cathode electrodes 13A of the cathode stripe lines 13 made of portions of transparent conductive film positioned under the emitter layers 12 for scanning. In synchronism with the scanning, a selection signal is fed to the gate electrodes 15. This permits selection of picture cells which are to be driven for luminescence. After selection of the picture cells, electrons are emitted from the emitter layers 12 arranged on the cathode electrodes 13A. Then, the electrons are permitted to travel through the openings of the gate electrodes 14 and then impinge on the phosphor layers 23 formed on the anode electrode 22, leading to luminescence of the phosphor layers 23, which is externally observed through the anode substrate 1.

The field emission type display device 16 thus provided is so constructed that picture cells which are to be driven for luminescence are selected by the cathode electrodes 13a and gate electrodes 14. Alternatively, for example, it may be so constructed that the cathode electrode 13A and emitter layer 12 each are formed all over the substrate 11 and the anode electrodes 22 each having the phosphor layer 23 deposited thereon and the gate electrodes 14 are arranged in a stripe-like manner and so as to be perpendicular to each other, resulting in picture cells which are to be driven for luminescence being selected by the anode electrodes 22 and gate electrodes 14. In this instance, the anode electrodes 22 may be prepared according to the procedure employed in the first embodiment described above.

Calcination of the substrate carried out while it has the phosphate low-softening glass pate 3 printed on the transparent conductive film 2 permits the portions of the transparent conductive film 2 positioned under the integrated low-softening glass 3A to lose conductivity as in the first embodiment described above.

Thus, the illustrated embodiment permits each of the portions of the transparent conductive film 2 made of a material mainly consisting of indium oxide and formed on the substrate which are not required to exhibit conductivity to form the insulating layer 4.

This permits patterning of the electrodes (anode electrodes 2A or cathode electrodes 13A) by the transparent conductive film and insulation of the transparent conductive film by calcination to be concurrently attained, to thereby eliminate resist coating, exposure, development and etching required in the conventional photolithography, leading to simplification of manufacturing of the field emission type display device and a reduction in manufacturing cost thereof.

Further, the illustrated embodiment eliminates removal of an etching agent as required in screen printing of an etching paste, to thereby provide a substrate for a display device without causing environmental pollution and while reducing the manufacturing cost.

The first embodiment described above may be modified in such a manner that an $SnO_2+Sb_2O_3$ film having a thickness of about 200 nm is formed by spraying thermal decomposition. Such modification permits the $SnO-_2O_5-ZnO$ film which is hard to be patterned by etching or the like to be effectively applied to a display device and the like.

In addition, the first embodiment described above may be so modified that a ZnAlO film of about 250 nm in thickness is formed by sputtering or the like. Such modification permits the patterning to be readily applied to a display device and the like without relying on etching.

Moreover, the first embodiment may be so modified that an Al film having a thickness of about 100 nm is formed by sputtering or the like. Such modification likewise permits the patterning to be readily applied to a display device and the like without relying on etching.

An Al film of about 100 nm in thickness shields light. Thus, in order to ensure observation of display through the Al thin film, a mesh-like pattern or the like may be formed.

The above description has been made in connection with display devices, in particular, a fluorescent display device and a field emission type display device. In this connection, the present invention may be effectively applied to a fluorescent display device wherein low-melting glass is used for a three-dimensional grid, a partition for a plasma-display element and the like. Also, the present invention may be applied to patterning of a conductive thin film including a step of subjecting an insulating substrate made of glass or the like to calcination in an atmosphere at a temperature equal to or above a softening point of low-softening glass.

As can be seen from the foregoing, the present invention is constructed so as to permit the portions of the transparent conductive film positioned under the cured low-softening glass to lose conductivity, to thereby form the insulating film. This permits patterning of electrodes by thick film printing and insulation by calcination to be concurrently attained. Thus, the present invention eliminates resist coating, exposure, development and etching which are steps required in the conventional photolithography, leading to simplification of manufacturing of the field emission type display device and a reduction in manufacturing cost thereof.

Further, the present invention eliminates removal of an etching agent as required in screen printing of an etching paste, to thereby provide a substrate for a display device without causing environmental pollution and while reducing the manufacturing cost.

In addition, the present invention facilitates patterning of an SnSbO thin film which is known to be a nesa film promising as a transparent conductive film because of being increased in mechanical and chemical strength.

Moreover, the conductive region and insulating region formed by the present invention provide a continuous pattern without being accurately positionally registered with each other, when both are observed from a side of the insulating substrate and a side of the pattern, respectively.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A method for manufacturing a conductive thin film patterned substrate, comprising the steps of:

forming a conductive thin film on an insulating substrate;

carrying out pattern formation of an insulating thick film layer consisting of low-softening glass having a chemical composition which leads to vitrification of the conductive thin film formed on the insulating substrate, the insulating thick film layer being formed on the conductive thin film; and carrying out calcination which permits a portion of the conductive thin film positioned under the insulating thick film layer to be vitrified integrally with the insulating thick film layer.

2. A method for manufacturing a conductive thin film patterned substrate, comprising the steps of:

forming a conductive thin film on an insulating substrate;

printing a paste consisting of a low-softening glass powder having a chemical composition which leads to vitrification of the conductive thin film on portions of the conductive thin film which are desired to be changed so as to exhibit insulating properties, to thereby carry out pattern formation of an insulating thick film layer, the insulating thick film layer being formed on the conductive thin film; and carrying out calcination which permits a portion of the conductive thin film layer positioned under the insulating thick film layer to be vitrified integrally with the insulating thick film layer, whereby patterning of an insulating thin film region and a conductive thin film region is carried out.

3. A method as defined in claim 2, wherein said conductive thin film has a thickness of 300 nm or less.

4. A method as defined in claim 2 or 3, wherein said conductive thin film is made of a material selected from the group consisting of materials represented by general formulas InSnO, SnSbO and ZnAlO, and Al.

5. A method as defined in any one of claims 2 and 3, wherein said low-softening glass is phosphate glass.

6. A method as defined in any one of claims 2 and 3, wherein said low-softening glass is $SnO-P_2O_5-ZnO$ glass.

7. A method as defined in claim 4, wherein said low-softening glass is phosphate glass.

8. A method as defined in claim 4, wherein said low-softening glass is $SnO-P_2O_5-ZNO$ glass.

* * * * *